US006182004B1

United States Patent
Komori (10) Patent No.: US 6,182,004 B1
(45) Date of Patent: Jan. 30, 2001

(54) APPARATUS AND METHOD FOR CONTROLLING ELECTRIC POWER SUPPLY IN NONVOLATILE MEMORY REWRITING OPERATION

(75) Inventor: Hirokazu Komori, Okazaki (JP)

(73) Assignee: Denso Corporation, Kariya (JP)

( * ) Notice: Under 35 U.S.C. 154(b), the term of this patent shall be extended for 0 days.

(21) Appl. No.: 09/321,872

(22) Filed: May 28, 1999

(30) Foreign Application Priority Data

Jul. 3, 1998 (JP) .................................................. 10-189215

(51) Int. Cl.[7] .............................. G06G 7/70; G11C 16/04
(52) U.S. Cl. .......................... 701/114; 701/115; 701/102; 365/185.04
(58) Field of Search ..................................... 701/114, 101, 701/102, 115, 29, 35; 365/185.04, 185.08, 185.33

(56) References Cited

U.S. PATENT DOCUMENTS

| 0,925,724 | 2/1999 | Ozeki et al. | 701/1 |
| 5,712,969 | 1/1998 | Walter et al. | 714/500 |
| 5,745,864 | * 4/1998 | Hosoe et al. | 701/35 |
| 5,881,295 | * 3/1999 | Iwata | 710/262 |
| 6,044,014 | * 3/2000 | Komori et al. | 365/185.04 |
| 6,046,937 | * 4/2000 | Komori et al. | 365/185.04 |

FOREIGN PATENT DOCUMENTS

| 2-100743 | 4/1990 | (JP) . |
| 7-271634 | 10/1995 | (JP) . |
| 7-311603 | 11/1995 | (JP) . |
| 97 48100 | 12/1997 | (WO) . |
| 98 08161 | 2/1998 | (WO) . |

OTHER PUBLICATIONS

U.S. application No. 09/257240, Ozeki et al., filed Feb. 1999.
"Data Integrity of EEPROM Data During Power Up/Down Cycles" IBM Technical Diclosure bulletin, US, IMB Corp. New York, vol. 32, No. 9B, 2/1990 pp. 277–278.

* cited by examiner

Primary Examiner—Henry C. Yuen
Assistant Examiner—Hieu T. Vo
(74) Attorney, Agent, or Firm—Nixon & Vanderhye P.C.

(57) ABSTRACT

A boot program or an internal combustion engine control program and data stored in a flash ROM is rewritten in a flash ROM rewriting processing by a microcomputer of an ECU. In this instance, a main relay control circuit is controlled to hold an electric power supply from a main relay, as the rewriting is disabled to be made repeatedly once the electric power supply is interrupted in the midst of the boot program. An entire electric power supply is interrupted by an ignition switch to enable the interruption in the midst of rewriting with respect to other programs. Thus, the electric power supply at the time of the program rewriting can be set to hold/stop in correspondence with the importance of the programs stored in the flash ROM.

8 Claims, 6 Drawing Sheets

APPARATUS AND METHOD FOR CONTROLLING ELECTRIC POWER SUPPLY IN NONVOLATILE MEMORY REWRITING OPERATION

CROSS REFERENCE TO RELATED APPLICATION

This application relates to and incorporates herein by reference Japanese Patent Application No. 10-189215 filed on Jul. 3, 1998.

BACKGROUND OF THE INVENTION

1. Field of the Invention

The present invention relates to an apparatus and method for controlling memory rewriting operation, and more particularly to an apparatus and method which has a function of holding an electric power supply during rewriting of programs and data stored in a rewritable nonvolatile memory.

2. Description of Related Art

A conventional electronic control unit for controlling a predetermined control object such as an internal combustion engine has a function of holding an electric power supply during a rewriting of a program stored in a rewritable nonvolatile memory. This apparatus is so constructed that a main relay is controlled to hold the electric power supply, thereby preventing a failure of program rewriting due to an accidental interruption of the electric power supply when rewriting data are transmitted from a memory rewriting device connected externally and the program stored in the rewritable nonvolatile memory is rewritten.

When the communication with the memory rewriting device fails or a rewriting processing program in the electronic control unit fails to run normally, the program rewriting is interrupted and the rewriting operation need to be started again from the beginning. If the electronic control unit continues to hold the main relay turned on in this instance, the electric power supply is not stopped and the rewriting processing can not be stopped forcibly even when an ignition switch is turned off.

It is proposed to avoid this problem that the main relay is turned off by the ignition switch when needed. It is however disadvantageous that, when the ignition switch is turned off accidentally during a rewriting of a boot program for initiating the rewriting processing program, the boot program is destroyed disabling the program rewriting again.

SUMMARY OF THE INVENTION

It is an object of the present invention to provide a nonvolatile memory rewriting apparatus and method which is capable of setting a hold/stop condition of an electric power supply during a program rewriting in correspondence with the importance or priority of programs stored in a rewritable nonvolatile memory.

According to the present invention, a control program for controlling a predetermined control object and a rewriting processing program including a rewriting program or a boot program, which are stored in storage areas in a rewritable nonvolatile memory and rewritable are rewritten when needed. In this instance, an electric power supply is maintained irrespective of an external interruption operation of the electric power supply, as the rewriting can not be restarted again once the electric power supply is interrupted in the course of rewriting of the rewriting processing program in the nonvolatile memory. On the other hand, the electric power supply is interrupted entirely in response to the external interruption operation of the electric power supply in the course of rewriting the control program in the nonvolatile memory. Thus, the hold/stop of the electric power supply at the time of rewriting can be set based on the importance of programs stored in the nonvolatile memory.

Further, the boot program in the nonvolatile memory is reduced in size to a small one which enables writing of the rewriting program from the outside into a readable/writable volatile memory. Thus, the nonvolatile memory can be reduced in its storage capacity by that reduced amount.

Still further, the nonvolatile memory stores therein a program which controls an electric power control circuit to hold the electric power supply irrespective of the external interruption operation of the electric power supply in the course of rewriting of the nonvolatile memory. The electric power supply is maintained similarly irrespective of the external interruption of the electric power supply during rewriting of the program which controls the electric power control circuit. Thus, as the rewriting of the program which controls the electric power control circuit is not interrupted to prevent program breakage, the electric power supply is ensured during a later rewriting of important programs.

BRIEF DESCRIPTION OF THE DRAWINGS

Other objects, features and advantages of the present invention will become more apparent from the following detailed description made with reference to the accompanying drawings. In the drawings.

DETAILED DESCRIPTION OF THE PREFERRED EMBODIMENT

The present invention is described in further detail hereunder with reference to various embodiments.

(First Embodiment)

Figure 1:
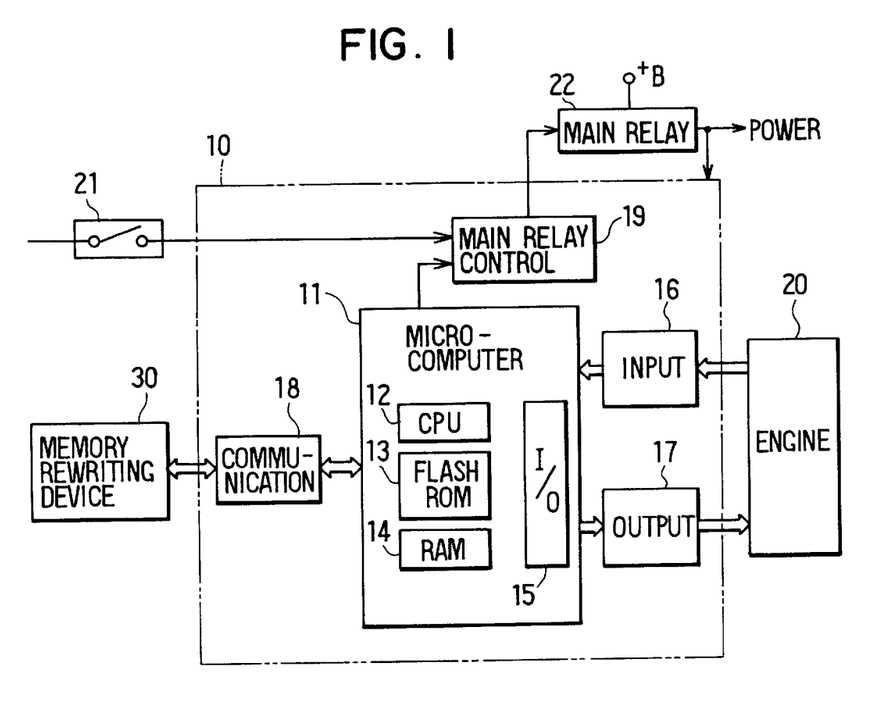
FIG. 1 is a block diagram showing an entire construction of an ECU which is mounted on a vehicle and to which an electronic control unit according to a first embodiment of the present invention is applied.

In FIG. 1 showing an entire construction of an internal combustion engine control apparatus mounted on a vehicle, an electronic control unit (ECU) for an internal combustion engine 20 is designated by numeral 10. Sensor signals from various sensors (not shown) which sense operation conditions of the internal combustion engine 20 are applied to the ECU 10. The sensor signals from those sensors are applied to a microcomputer 11 after waveform-shaping, A/D conversion and the like processing by an input circuit 16 in the ECU 10. In the microcomputer 11, optimum control amounts of the internal combustion engine 20 are calculated based on the sensor signals from the input circuit 16, and control signals indicative of the calculation results are produced to an output circuit 17. Actuators of the internal combustion engine 20, such as an igniter, injectors (fuel injection valves) and the like which are not shown in the figure, are driven by the control signals from the output circuit 17. Various warning lights (not shown) may be driven when needed by the ECU 10. Further, the ECU 10 includes a communication circuit 18 for executing data communications with a memory rewriting device 30, which is connectable when an internal combustion engine control program and data within the microcomputer 11 are to be rewritten.

The microcomputer 11 in the ECU 10 is constructed as a logic arithmetic circuit, which comprises a CPU 12 as a known central processing unit, a flash ROM 13 for storing therein programs and data, a RAM 14 for storing various data, an I/O (input-output) circuit 15 for receiving signals from the input circuit 16 and the communication circuit 18, etc. and applying the control signals to the output circuit 17, a bus line connecting those circuits, and the like. Here, the flash ROM 13 is a memory, that is, a rewritable nonvolatile memory, which is capable of erasing programs and data once written and writing programs and data again. An EEPROM or the like may be used therefor.

Further, a main relay control circuit 19 is provided in the ECU 10. This main relay control circuit 19 is constructed as an OR circuit which receives as input signals outputs of an ignition switch 21 and the microcomputer 1. That is, the main relay circuit 19 turns on a main relay 22 to supply a battery power voltage +B to the ECU 10 and other peripheral devices (not shown), when at least one of the control signals applied from the ignition switch 21 and the microcomputer 11 is leveled to ON (high level).

Thus, when the main relay 22 is to be controlled based on ON/OFF of the ignition switch 21, the control signal applied from the microcomputer 11 to the main relay control circuit 19 is leveled to OFF (low level). Further, when the main relay 22 is to be held at ON irrespective of ON/OFF condition of the ignition switch 21, the control signal from the microcomputer 11 to the main relay control circuit 19 is leveled to ON.

Figure 2A:
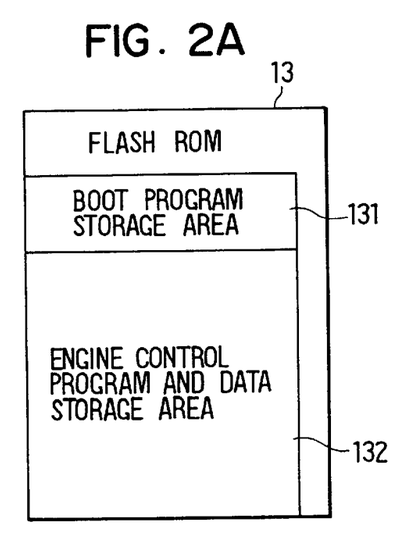
FIGS. 2A and 2B are block diagrams showing internal constructions of a flash ROM and a RAM used in the electronic control unit according to the first embodiment.
Figure 2B:
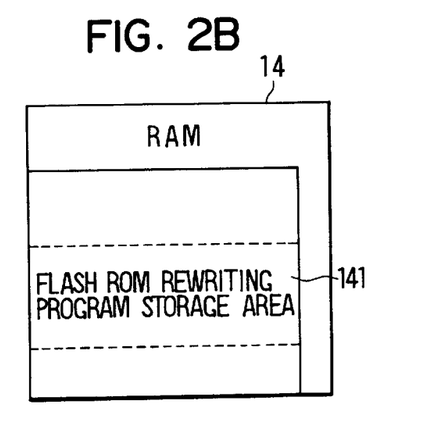

The internal constructions of the flash ROM 3 and RAM 14 of the microcomputer 11 used in the ECU 10 used in the electronic control unit according to this embodiment are shown in FIGS. 2A and 2B. That is, as shown in FIG. 2A, the flash ROM 13 is formed with a storage area 131 for a boot program, which is for reading out a flash ROM rewriting program from the memory rewriting device 30 as a rewriting program and writing the same into a flash ROM rewriting program storage area 141 within the RAM 14 (FIG. 2B), and storage area 132 for storing the internal combustion engine control program and data. Those storage areas 131 and 132 are separated from each other.

A sequence of the flash ROM rewriting processing of the CPU 12 in the microcomputer 11 of the ECU 10 used in the first embodiment is described next based on the flow diagram shown in FIG. 3. This flash ROM rewriting routine is executed repeatedly by the CPU 12 at every program rewriting request from the memory rewriting device 30. Here, the boot program is required to exist in the boot program storage area 131 for rewriting the boot program or the internal combustion engine control program and data in the flash ROM 13 shown in FIG. 2A, and hence the boot program is started first.

Figure 3:
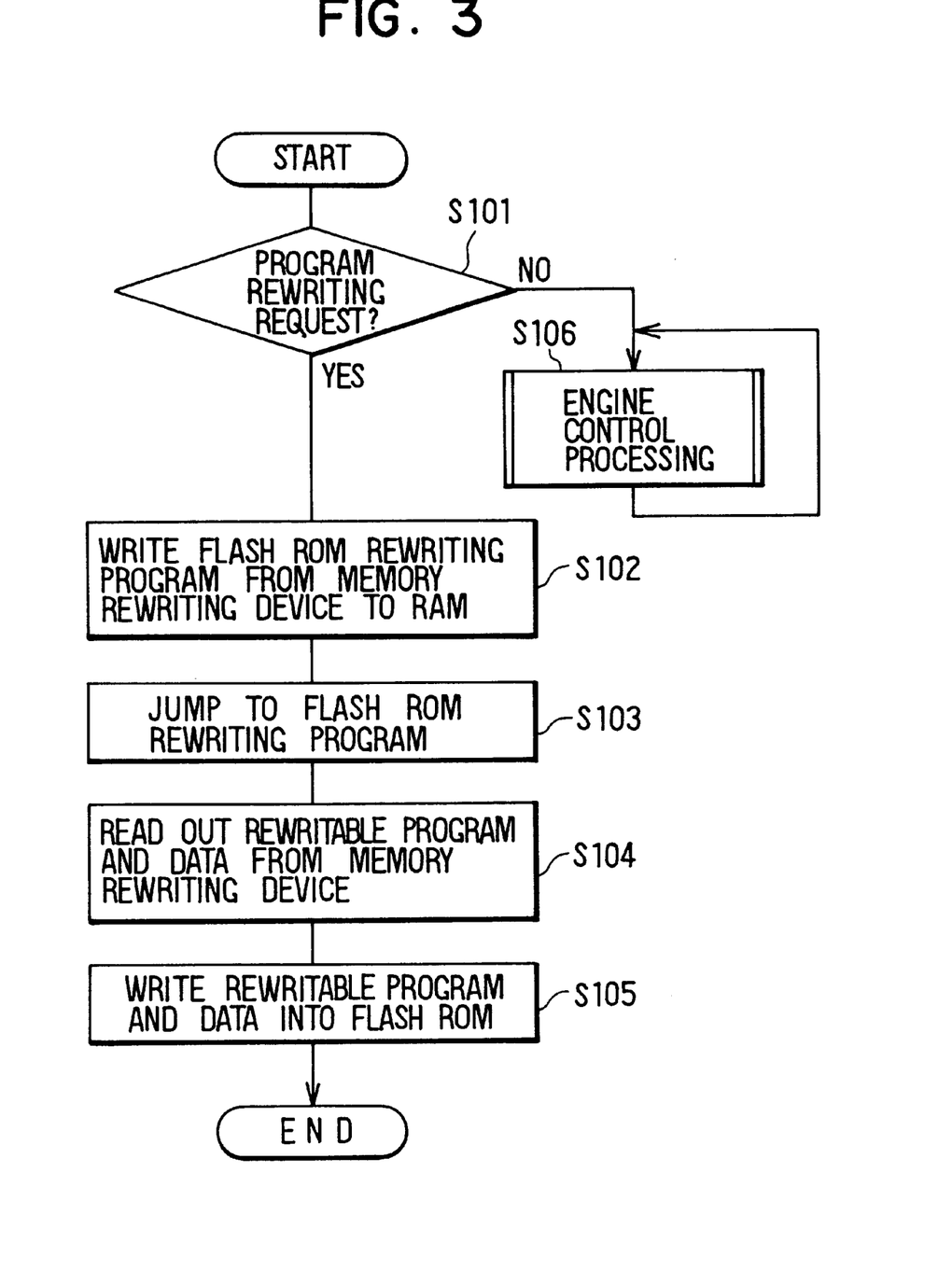
FIG. 3 is a flow diagram showing a flash ROM rewriting processing of a CPU in a microcomputer of the ECU used in the electronic control unit according to the first embodiment.

In FIG. 3, it is checked at step S101 whether there exists a program rewriting request from the memory rewriting device 30. If the check result at step S101 is YES, that is, there exists the program rewriting request from the memory rewriting device 30, the processing proceeds to step S102, the flash ROM rewriting program as the rewriting program is written from the memory rewriting device 30 into the flash ROM rewriting program storage area 141 in the RAM 14. The processing then proceeds to step S103, and jumps to the flash ROM rewriting program written into the flash ROM rewriting program in the RAM 14. Then proceeding to step S104, a rewritable program and data, that is, the boot program or the internal combustion engine control program and data, are read out through communications with the memory rewriting device 30 made by the flash ROM rewriting program. Then proceeding to step S105, the rewritable program and data read out at step S104, that is, the boot program or the internal combustion engine control program and data, are written into the boot program storage area 131 or the internal combustion engine control program and data storage area 132 (FIG. 2A). Thus, this routine ends.

If the check result at step S101 is NO, that is, there is no program rewriting request from the memory rewriting device 30, on the other hand, the processing proceeds to step S106 and executes a normal internal combustion engine control processing. In the internal combustion engine control processing, the optimum ignition timing, fuel injection amount and the like are calculated based on the various sensor signals from the input circuit 16 and the internal combustion engine control program and data stored in the internal combustion engine control program and data storage area 132 in the flash ROM 13. Based on the calculation results, the control signals for driving the actuators such as the igniter, injectors and the like (not shown) are produced through the output circuit 17. Thus, the operating condition of the internal combustion engine 20 is controlled to its optimum condition by the execution of the internal combustion engine control processing.

According to this construction, it is only required to provide in the flash ROM 13 the boot program storage area 131 for storing a small-sized boot program, which is for writing the flash ROM rewriting program into the RAM 14. That is, as long as the boot program exists in the boot program storage area 131 within the flash ROM 13, it is enabled to revive the contents stored in the internal combustion engine control program and data storage area 132 again by rewriting even when those are broken or lost accidentally.

A sequence of the main relay control processing of the CPU 12 in the microcomputer 11 of the ECU 10 used in the first embodiment of the present invention is described next based on the flow diagram shown in FIG. 4 with reference to FIGS. 5 and 6. Here, FIG. 5 is a timing diagram showing timings of rewriting the internal combustion engine control program and data by the main relay control, and FIG. 6 is a timing diagram showing timings of rewriting the boot program by the main relay control. It is to be noted that this main relay control routine shows details of the main relay control which corresponds to steps S104 and S105 in FIG. 3.

Figure 4:
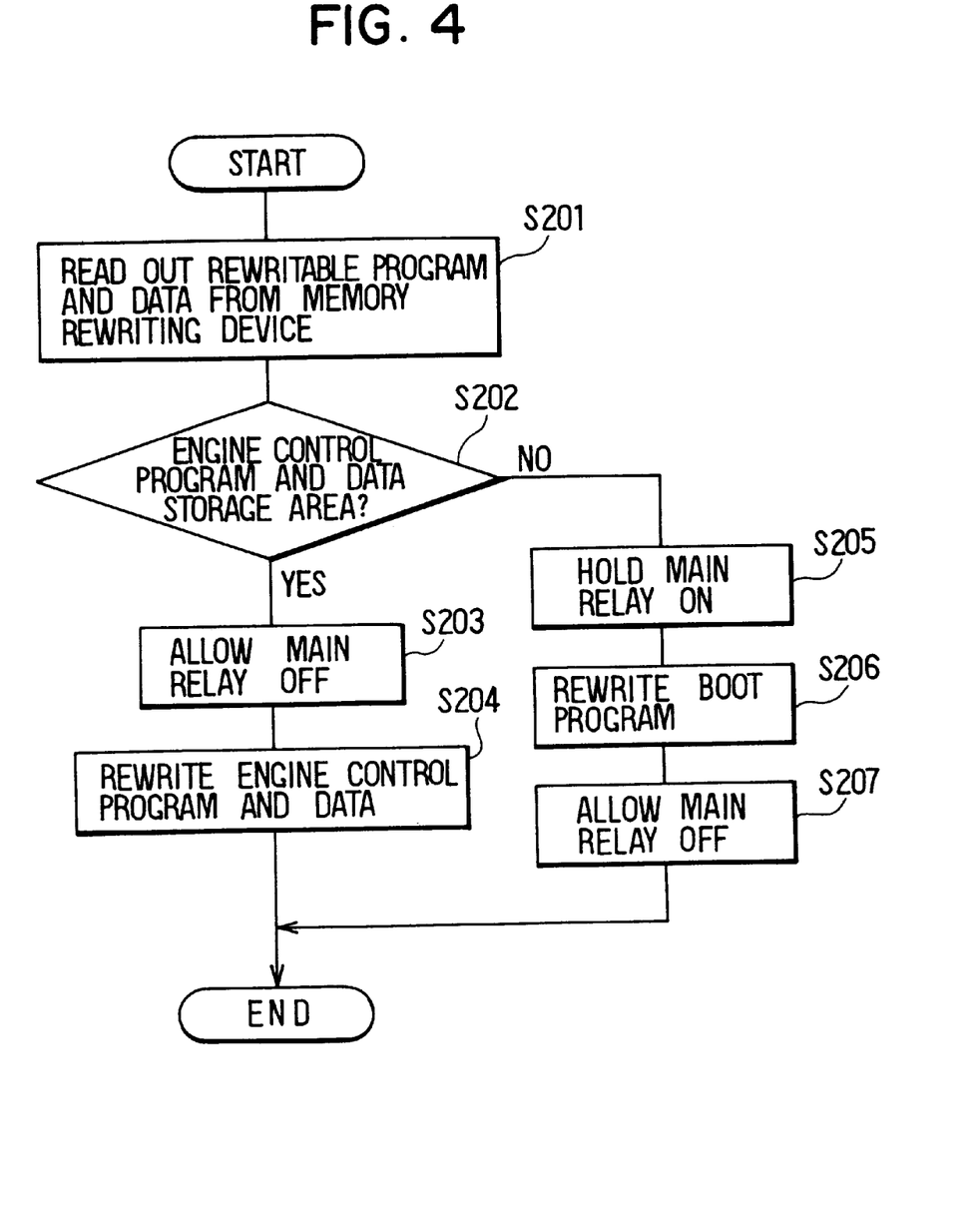
FIG. 4 is a flow diagram showing a main relay control processing of the CPU in the microcomputer of the ECU used in the electronic control unit according to the first embodiment.
Figure 5:
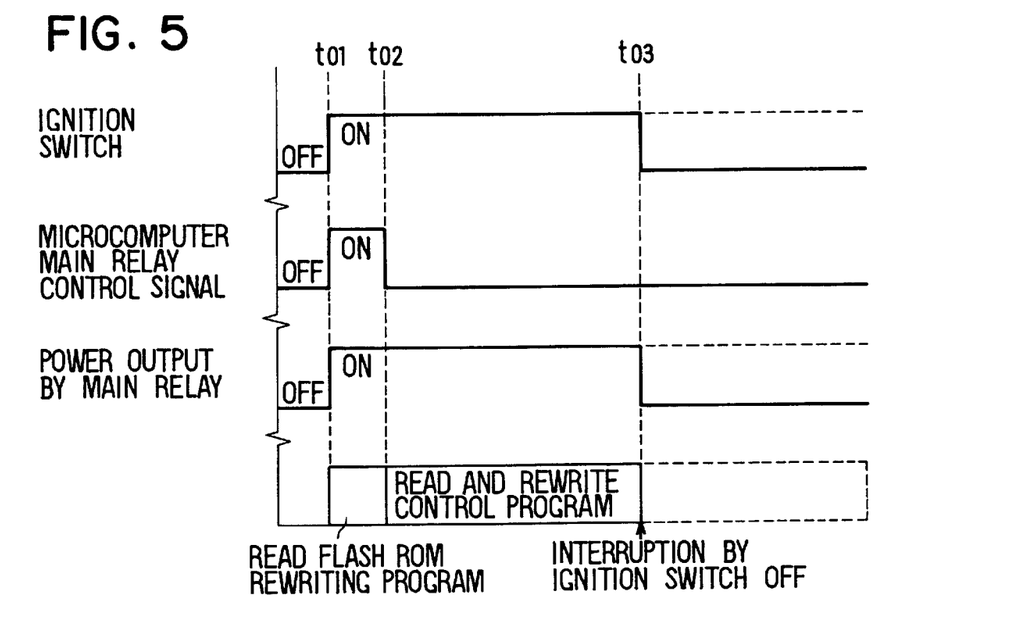
FIG. 5 is a timing diagram showing timings of rewriting an internal combustion engine control program and data by a main relay control in the electronic control unit according to the first embodiment.
Figure 6:
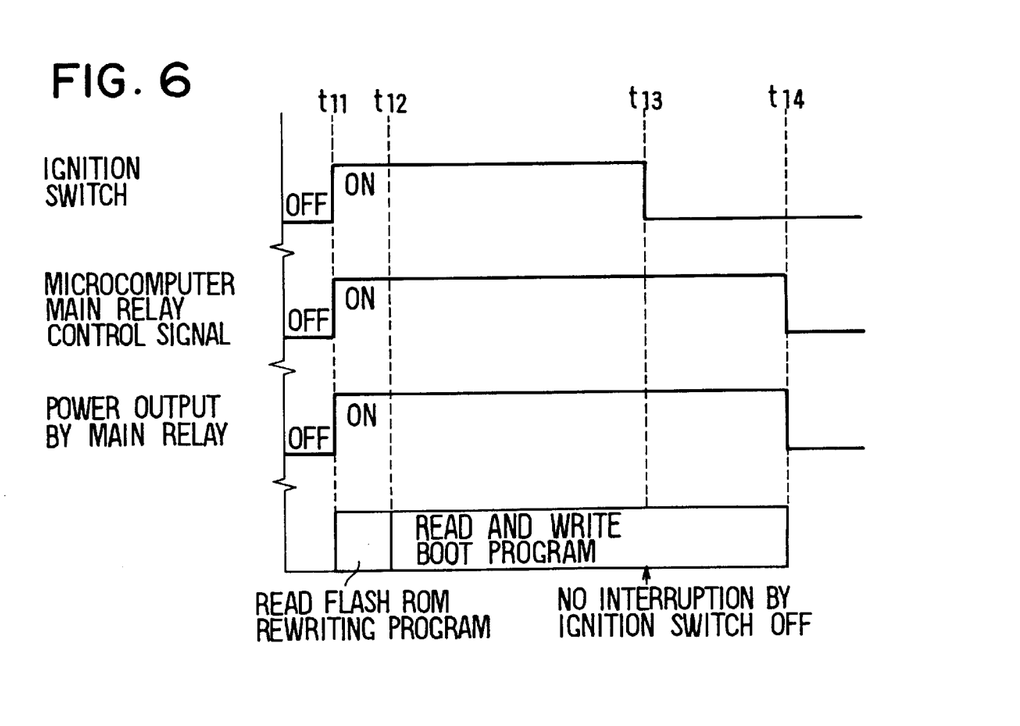
FIG. 6 is a flow diagram showing timings of rewriting a boot program by the main relay control in the electronic control unit according to the first embodiment.

In FIG. 4, the rewritable program and data are read out from the memory rewriting device 30 at step S201 during time periods t01–t02 in FIG. 5 and t11–t12 in FIG. 6. Then, the processing proceeds to step S202 and checks by addresses whether the object of rewriting by the rewritable program and data read out at step S201 is the storage area 132 of the internal combustion engine control program and data in the flash ROM 13. If the check result at step S202 is YES, that is, the object of rewriting by the internal combustion engine control program and data read out from the memory rewriting device 30 is the storage area 132 of the internal combustion engine control program and data in the flash ROM 13, the processing proceeds to step S203 and sets the control signal from the microcomputer 11 to the main relay control circuit 19 to OFF at time t02 in FIG. 5 so that the main relay 22 is set to the OFF-enabling condition. Thus, the main relay 22 is controlled to the OFF-enabling condition, so that cancellation of the rewriting may be executed in response to OFF of the ignition switch 21. Proceeding next to step S204, the rewriting of the internal combustion engine control program and data is executed and the routine ends. At time t03 in FIG. 5, rewriting is canceled in the midst of the rewriting in response to OFF of the ignition switch 21. As the electric power output is stopped by the OFF of the main relay 22, the rewriting processing of the internal combustion engine control program and data is forcibly interrupted.

As described above, the main relay control signal from the microcomputer 11 is leveled to OFF at time t02 in FIG. 5 after the flash ROM rewriting program has been read out, in the case of rewriting the internal combustion engine control program and data. As a result, the interruption of program rewriting is enabled by the OFF of the ignition switch 21 at time t03 in FIG. 5.

If the check result at step S202 is NO, that is, the object of rewriting by the rewritable program and data read out from the memory rewriting device 30 is the storage area 131 of the boot program within the flash ROM 13, the processing proceeds to step S205. Here, the control signal from the microcomputer 11 to the main relay control circuit 19 is set to ON during time period t11–t14 in FIG. 6, so that the boot program stored in the boot program storage area 131 in the flash ROM 13 is protected from being broken in the midst of rewriting. Thus, as shown at time t13 in FIG. 6, the main relay 22 is held ON to maintain the electric power output irrespective of ON/OFF of the ignition switch 21. Proceeding next to step S206, the rewriting of the boot program is executed. At the following step S207, the control signal from the microcomputer to the main relay control circuit 19 is returned to OFF at time t14 in FIG. 6 to set the main relay 22 to the OFF-enabling condition, thus ending this routine.

As described above, as the main relay control signal from the microcomputer 11 is held ON during the boot program rewriting, the rewriting of the boot program is not interrupted even when the ignition switch 21 is turned to OFF. Thus, the boot program is not broken and hence disabling the next rewriting is prevented.

(Second Embodiment)

A modification of the internal construction of the flash ROM 14 and the RAM 14 in the microcomputer 11 as the second embodiment is described next with reference to the block diagram shown in FIGS. 7A and 7B. The same construction or similar parts as those in FIGS. 2A and 2B are designated by the same numerals and symbols in those figures, and the detailed description of those is omitted.

Figure 7A:
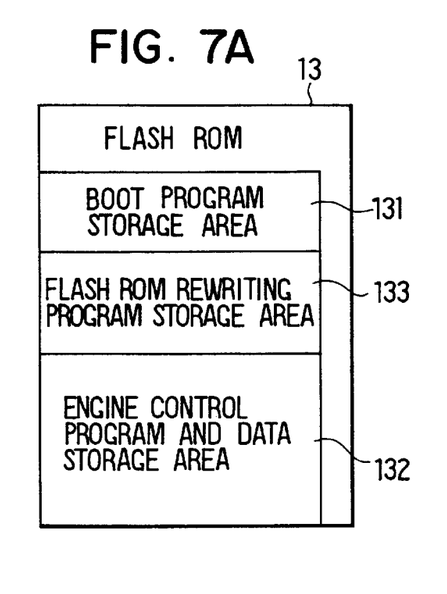
FIGS. 7A and 7B are block diagrams showing internal constructions of a flash ROM and a RAM used in a microcomputer of an ECU according to a second embodiment of the present invention.

In this embodiment, as shown in FIG. 7A, the flash ROM rewriting program as the rewriting program is not read in from the memory rewriting device 30, but is stored in advance in the flash ROM rewriting program storage area 133 provided in the flash ROM 13. Thus, at the time of flash ROM rewriting, the flash ROM rewriting program is read out from the internal flash ROM rewriting program storage area 133 by the boot program stored in the boot program storage area 131, and is written into the flash ROM rewriting program storage area 141. Then, the flash ROM rewriting processing is executed with respect to the actual boot program in the boot program storage area 131 in the flash ROM 13, the internal combustion engine control program and data in the internal combustion engine control program and data storage area 132, or the flash ROM rewriting program in the flash ROM rewriting program storage area 133 is executed.

The flash ROM rewriting processing using the flash ROM 13 and the RAM 14 in FIGS. 7A and 7B by the CPU 12 in the microcomputer 11 of the ECU 10 is described next with reference to FIG. 8. It is to be noted that this flash ROM rewriting routine is executed repeatedly by the CPU 12 at every program rewriting request form the memory rewriting device 30. Here, as it is required that the boot program exists within the boot program storage area 131 to rewrite the internal combustion engine control program and data or the flash ROM rewriting program, the boot program is started first.

Figure 7B:
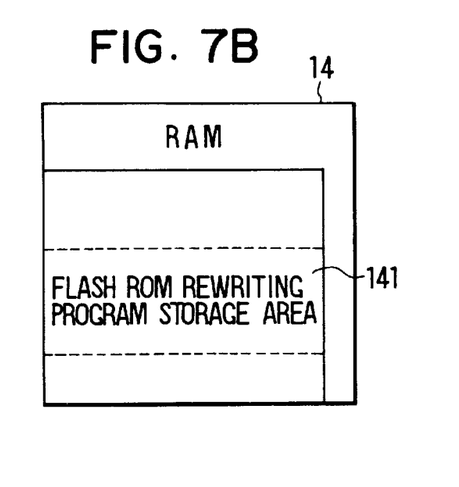
Figure 8:
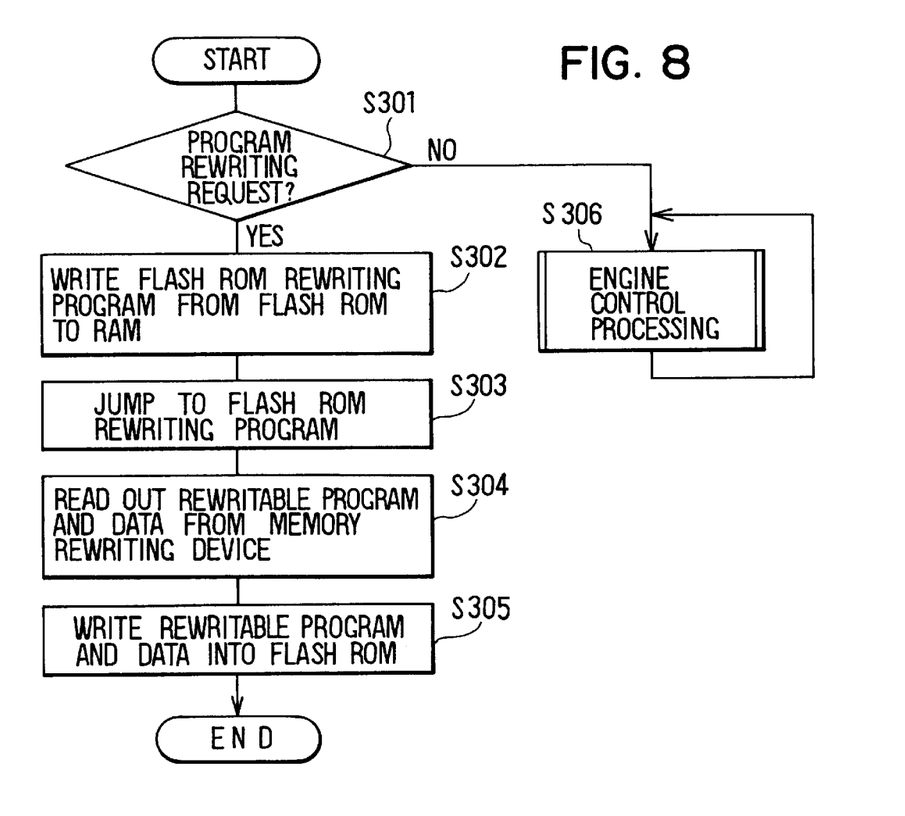
FIG. 8 is a flow diagram showing a flash ROM rewriting processing of a CPU in the microcomputer of the ECU according to the second embodiment shown in FIG. 7.

In FIG. 8, it is checked at step S301 whether there exists a program rewriting request from the memory rewriting device 30. If the check result at step S301 is YES, that is, there exists the program rewriting request from the memory rewriting device 30, the processing proceeds to step S302, the flash ROM rewriting program as the rewriting program stored in the flash ROM rewriting program storage area 133 within the flash ROM 13 is written into the flash ROM rewriting program storage area 141 in the RAM 14 (FIG. 7B). The processing then proceeds to step S303, and jumps to the flash ROM rewriting program written into the flash ROM rewriting program storage area 141 in the RAM 14. Then proceeding to step S304, a rewritable program and data, that is, the boot program, the internal combustion engine control program and data, or the flash ROM rewriting program are read out through communications with the memory rewriting device 30 made by the flash ROM rewriting program. Then proceeding to step S305, the rewritable program and data, that is, the boot program, the internal combustion engine control program and data or the flash ROM rewriting program is written into the boot program storage area 131, the internal combustion engine control program and data storage area 132 or the flash ROM rewriting program storage area 133 (FIG. 7A). Thus, this routine ends.

If the check result at step S301 is NO, that is, there is no program rewriting request from the memory rewriting device 30, on the other hand, the processing proceeds to step S306 and executes the normal internal combustion engine control processing. In the internal combustion engine control processing at step S306, the optimum ignition timing, fuel injection amount and the like are calculated based on the various sensor signals from the input circuit 16 and the internal combustion engine control program and data stored in the internal combustion engine control program and data storage area 132 in the flash ROM 13. Based on the calculation results, the control signals for driving the actuators such as the igniter, injectors and the like (not shown) are produced through the output circuit 17. Thus, the operating condition of the internal combustion engine 20 is controlled to its optimum condition by the execution of the internal combustion engine control processing.

The sequence of the main relay control processing of the CPU 12 in the microcomputer 11 of the ECU 10 using the flash ROM 13 and the RAM 14 in FIGS. 7A and 7B are described next based on the flow diagram shown in FIG. 9. It is to be noted that this main relay control routine shows details of the main relay control which corresponds to steps S304 and S305 in FIG. 8.

Figure 9:
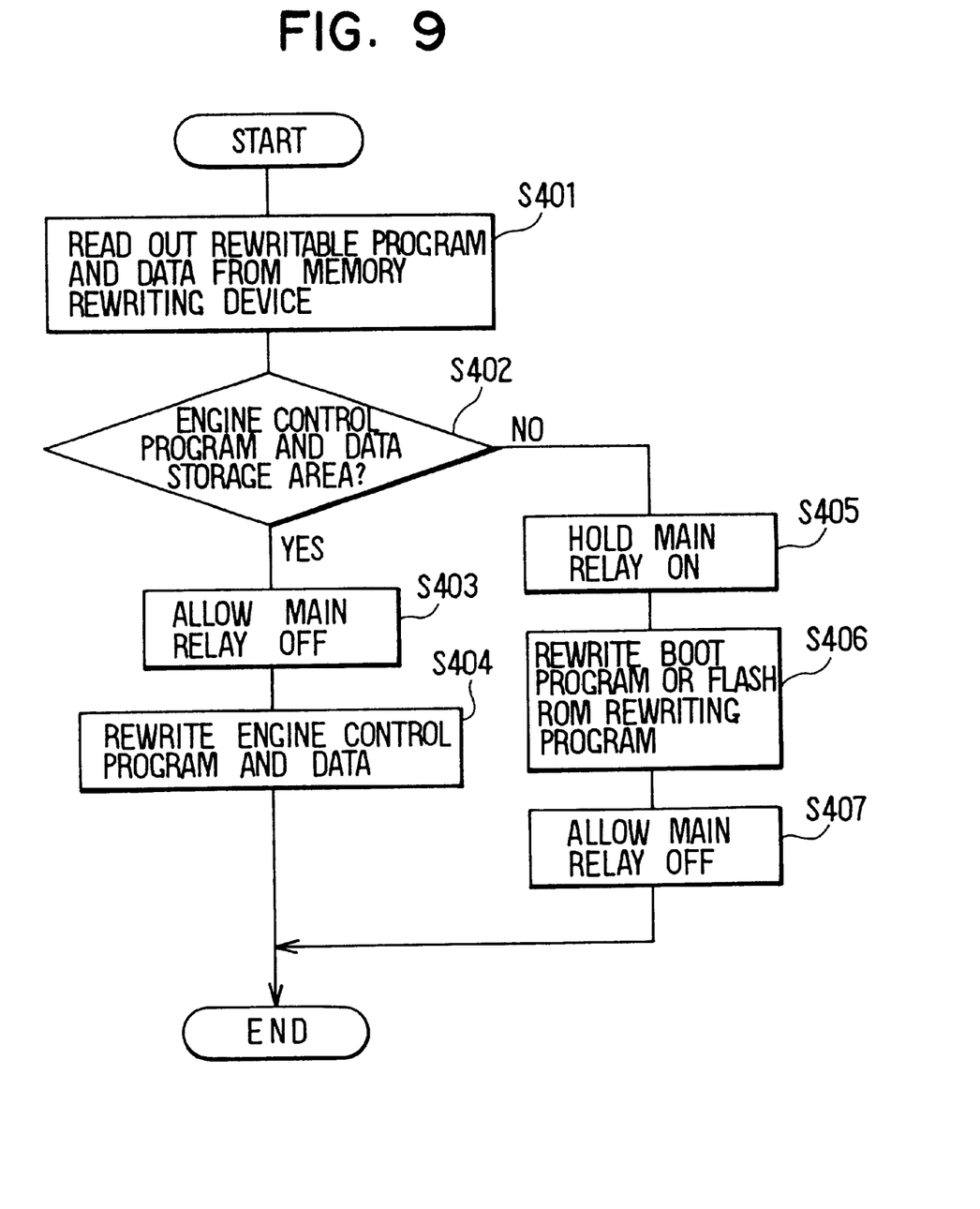
FIG. 9 is a flow diagram showing the main relay control processing of the CPU in the microcomputer of the ECU according to the second embodiment shown in FIG. 7.

In FIG. 9, the rewritable program and data are read out from the memory rewriting device 30 at step S401. Then, the processing proceeds to step S402 and checks by addresses whether the object of rewriting by the rewritable program and data read out at step S401 is the storage area 132 of the internal combustion engine control program and data in the flash ROM 13. If the check result at step S402 is YES, that is, the object of rewriting by the internal combustion engine control program and data read out from the memory rewriting device 30 is the storage area 132 of the internal combustion engine control program and data in the flash ROM 13, the processing proceeds to step S403 and sets the control signal from the microcomputer 11 to the main relay control circuit 19 to OFF so that the main relay 22 is set to the OFF-enabling condition. Thus, the main relay 22 is controlled to the OFF-enabling condition, so that cancellation of the rewriting may be executed in response to OFF of the ignition switch 21. Proceeding next to step S404, the rewriting of the internal combustion engine control program and data is executed and the routine ends.

If the checkresult at step S402 is NO, that is, the object of rewriting by the rewritable program and data read out from the memory rewriting device 30 is the storage area 131 of the boot program or the flash ROM rewriting program storage area 133 within the flash ROM 13, the processing proceeds to step S405. Here, the control signal from the microcomputer 11 to the main relay control circuit 19 is set to ON, so that the boot program stored in the boot program storage area 131 in the flash ROM 13 or the flash ROM rewriting program stored in the flash ROM rewriting program storage area 133 as the rewriting program is protected from being broken in the midst of rewriting. Proceeding next to step S406, the rewriting of the boot program or the flash ROM rewriting program is executed under the condition that the main relay 22 is held ON by the control signal (ON) from the microcomputer 11. At the following step S407, the control signal from the microcomputer 11 to the main relay control circuit 19 is returned to OFF to set the main relay 22 to the OFF-enabling condition again, thus ending this routine.

As described above, as the main relay control signal from the microcomputer 11 is held ON during the boot program rewriting, the rewriting of the boot program or the flash ROM rewriting program is not interrupted even when the ignition switch 21 is turned to OFF. Thus, the boot program or the flash ROM rewriting program is not broken and hence disabling the next rewriting is prevented.

Thus, the ECU 10 according to the present embodiment enables the interruption of the entire electric power supply upon turning off of the ignition switch 21 when the storage area 132 of the internal combustion engine control program and data in the flash ROM 13 is being rewritten. The ECU 10, however, disables the interruption of the electric power supply to hold the electric power supply from the main relay 22 irrespective of the ON/OFF condition of the ignition switch 21 by controlling the main relay control circuit 19 when the boot program storage area 131 or the flash ROM rewriting program storage area 133 of the flash ROM 13 is being rewritten.

Therefore, the boot program stored in the boot program storage area 131 in the flash ROM 13, the flash ROM rewriting program stored in the flash ROM rewriting program storage area 133 and the internal combustion engine control program and data stored in the internal combustion engine control program and data storage area 132 can be rewritten as needed. In this instance, the rewriting can not be enabled again, once the electric power supply is interrupted in the midst of the rewriting of the boot program storage area 131 or the flash ROM rewriting program storage area 133 in the flash ROM 13. For this reason, the main relay control circuit 19 is controlled to hold the electric power supply from the main relay 22. The entire electric power supply is interrupted through the main relay 22 in response to the electric power interruption by the ignition switch 21 to enable electric power interruption in the midst of the rewriting when the rewriting is being made to the internal combustion engine control program and data storage area 132 in the flash ROM 13. Thus, it is made possible to set hold/stop of the electric power supply at the time of program rewriting based on the importance of the program stored in the flash ROM 13.

The rewriting processing program is the boot program for reading the flash ROM rewriting program from the outside, and the flash ROM rewriting program is written into the RAM 14 as the readable/writable volatile memory to operate, and includes the program therein which controls the main relay control circuit 19. As a result, the boot program in the flash ROM 13 is only required to read the flash ROM rewriting program from the outside into the RAM 14 and can be reduced in size. Thus, the flash ROM 13 can be a small storage capacity type in correspondence with the reduction in the boot program storage area 131.

Further, the program for controlling the main relay control circuit 19 as the electric power control means during the rewriting to the flash ROM 13 as the nonvolatile memory is stored in the flash ROM 13, and controls the main relay control circuit 19 to hold the electric power supply irrespective of the external interruption of the electric power supply by the ignition switch 21 when the storage area of the program is being rewritten. That is, the program for controlling the main relay control circuit 19 to hold the electric power supply irrespective of the external interruption of the electric power supply in the course of rewriting of the flash ROM 13 is stored in the flash ROM 13. The electric power supply is held also in the course of rewriting the program for controlling the main relay control circuit 19, irrespective of the external interruption of the electric power supply. Thus, as the rewriting of the program for controlling the main relay control circuit 19 is not interrupted, the electric power supply is not stopped or interrupted temporarily at the time of rewriting important programs.

The present invention should not be limited to the disclosed embodiments, but may be implemented in many other ways without departing from the spirit of the invention.

What is claimed is:

1. An electronic control apparatus comprising:

a rewritable nonvolatile memory for storing in respective storage areas thereof a control program for controlling a predetermined control object and a rewriting processing program, which includes a rewriting program for executing a rewriting or a boot program for reading in the rewriting program from an outside;

electronic control means for executing a processing corresponding to the control program or the rewriting processing program stored in the nonvolatile memory; and electric power control means for holding an electric power supply in response to an instruction from the electronic control means even when the electric power supply to the electronic control means is interrupted externally, wherein the electronic control means interrupts an entire electric power supply upon an external interruption of the electric power supply when the storage area of the control program in the nonvolatile memory is being rewritten, and the electronic control means holds the electric power supply irrespective of the external interruption of the electric power supply by controlling the electric power control means when the storage area of the rewriting processing in the nonvolatile memory is being rewritten.

2. An electronic control apparatus as in claim 1, wherein the rewriting processing program is the boot program for reading the rewriting program from the outside, and the rewriting program is written into a readable/writable volatile memory and includes a program therein which controls the electric power control means.

3. An electronic control apparatus as in claim 1, wherein the program for controlling the electric power control means during a rewriting to the nonvolatile memory is stored in the nonvolatile memory, and controls the electric power control means to hold the electric power supply irrespective of the external interruption of the electric power supply when the storage area of the program is being rewritten.

4. An electronic control apparatus as in claim 1, wherein the control object is an internal combustion engine, and the electric power control means includes a relay controlled by an ignition switch provided externally of the electronic control means and the control signal of the electronic control means.

5. A control method for an electronic control apparatus which is rendered operative with an electric power supply through a relay controllable by an external switch and capable of rewriting a control program for controlling a control object and a rewriting processing program including a boot program stored in a nonvolatile memory, the control method comprising the steps of:

checking whether the control program and the rewriting processing program in the nonvolatile memory is requested to be rewritten by a memory rewriting device external of the electronic control apparatus;

generating a relay control signal when the checking step determines that the rewriting processing program in the nonvolatile memory is requested to be rewritten; and controlling the electric power supply through the relay in response to the external switch when the relay control signal is absent, and in response to the relay control signal irrespective of the external switch when the relay control signal is present, so that the electric power supply is continued when the rewriting processing program is rewritten.

6. A control method as in claim 5, further comprising the steps of:

copying a memory rewriting program from a memory rewriting device into a volatile memory of the electronic control apparatus when a rewriting is requested from the memory rewriting device; and rewriting the boot program in the nonvolatile memory with a new boot program read out from the memory rewriting device.

7. A control method as in claim 5, further comprising the steps of:

copying a memory rewriting program of the rewriting processing program from the nonvolatile memory into a volatile memory of the electronic control apparatus when a rewriting is requested from the memory rewriting device; and rewriting at least one of the boot program and a memory rewriting program in the nonvolatile memory with a new one of a boot program and a memory rewriting program read out from the memory rewriting device.

8. A control method as in claim 5, wherein the control object is an internal combustion engine, and an external switch is an ignition switch.

* * * * *